United States Patent
Naundorf et al.

(12)

(10) Patent No.: US 8,591,689 B2
(45) Date of Patent: Nov. 26, 2013

(54) METHOD FOR SELECTIVELY PRODUCING FILM LAMINATES FOR PACKAGING AND FOR INSULATING UNPACKAGED ELECTRONIC COMPONENTS AND FUNCTIONAL PATTERNS AND CORRESPONDING DEVICE

(75) Inventors: Jörg Naundorf, München (DE); Karl Weidner, München (DE); Hans Wulkesch, München (DE)

(73) Assignee: Siemens Aktiengesellschaft, Munich (DE)

(*) Notice: Subject to any disclaimer, the term of this patent is extended or adjusted under 35 U.S.C. 154(b) by 1212 days.

(21) Appl. No.: 12/224,175

(22) PCT Filed: Dec. 20, 2006

(86) PCT No.: PCT/EP2006/070026
§ 371 (c)(1),
(2), (4) Date: Aug. 20, 2008

(87) PCT Pub. No.: WO2007/096018
PCT Pub. Date: Aug. 30, 2007

(65) Prior Publication Data
US 2009/0029035 A1 Jan. 29, 2009

(30) Foreign Application Priority Data
Feb. 20, 2006 (DE) .......................... 10 2006 007 790
Mar. 16, 2006 (DE) .......................... 10 2006 012 232

(51) Int. Cl.
*B29C 65/00* (2006.01)
*B32B 37/00* (2006.01)
*B32B 38/04* (2006.01)

(52) U.S. Cl.
USPC ........ 156/251; 156/272.8; 156/285; 156/299; 156/308.4; 156/300

(58) Field of Classification Search
USPC .............. 156/251, 257, 268, 272.8, 285, 299, 156/308.4, 515, 300; 427/596, 81, 294, 427/295, 296, 96.1, 96.2, 96.5; 29/825
See application file for complete search history.

(56) References Cited

U.S. PATENT DOCUMENTS

| | | | |
|---|---|---|---|
| 4,539,059 A * | 9/1985 | Burger et al. ................. | 156/251 |
| 4,875,279 A * | 10/1989 | Sakiadis ......................... | 29/740 |
| 6,492,194 B1 | 12/2002 | Bureau | |
| 7,765,692 B2 * | 8/2010 | Takada et al. ................... | 29/852 |
| 2001/0039071 A1 | 11/2001 | Akram | |
| 2010/0273313 A1 * | 10/2010 | Urairi et al. ................... | 438/463 |

FOREIGN PATENT DOCUMENTS

| | | |
|---|---|---|
| DE | 20011590 U1 | 9/2000 |
| WO | WO 2004096483 A1 | 11/2004 |

* cited by examiner

Primary Examiner — Linda L. Gray
(74) Attorney, Agent, or Firm — Staas & Halsey LLP

(57) ABSTRACT

A method for selectively producing film laminates for packaging and for insulating unpackaged electronic components and functional patterns and corresponding device. The method coat surface regions of functional patterns arranged on a substrate and/or of surface regions of semiconductor chips arranged on the substrate. An insulation is to be effectively adapted in its properties to different requirements of functional patterns and/or electronic components. Film regions are laminated on surface regions in such a way that the properties of the plastics material of the film regions are adapted to the function of the film. This adaptation is individual and selective. Various films are used. The method is suitable in particular for coating or packaging electronic components or active and passive devices.

16 Claims, 2 Drawing Sheets

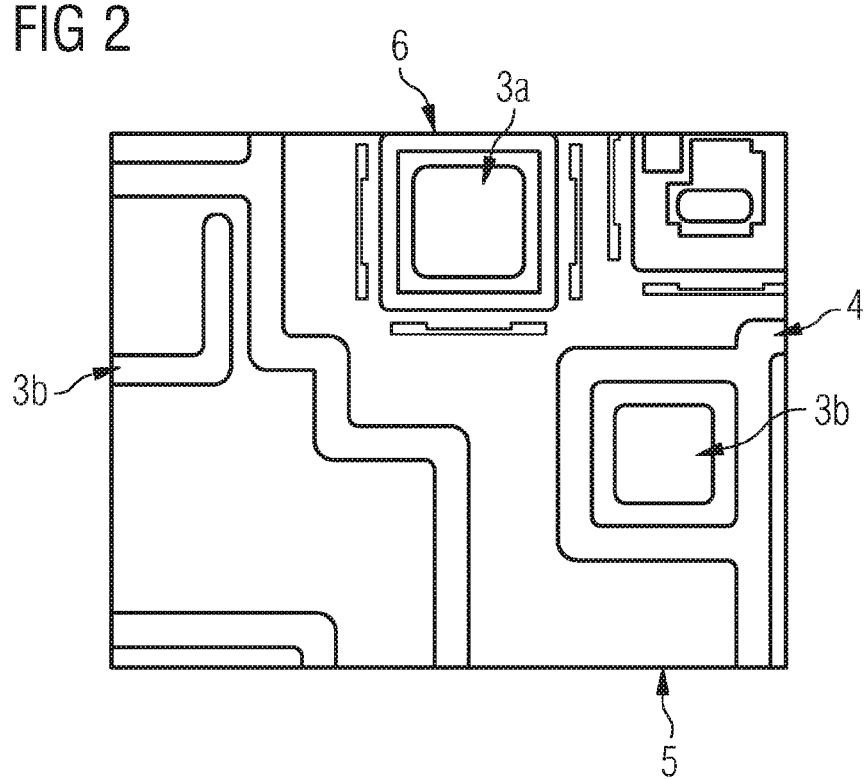
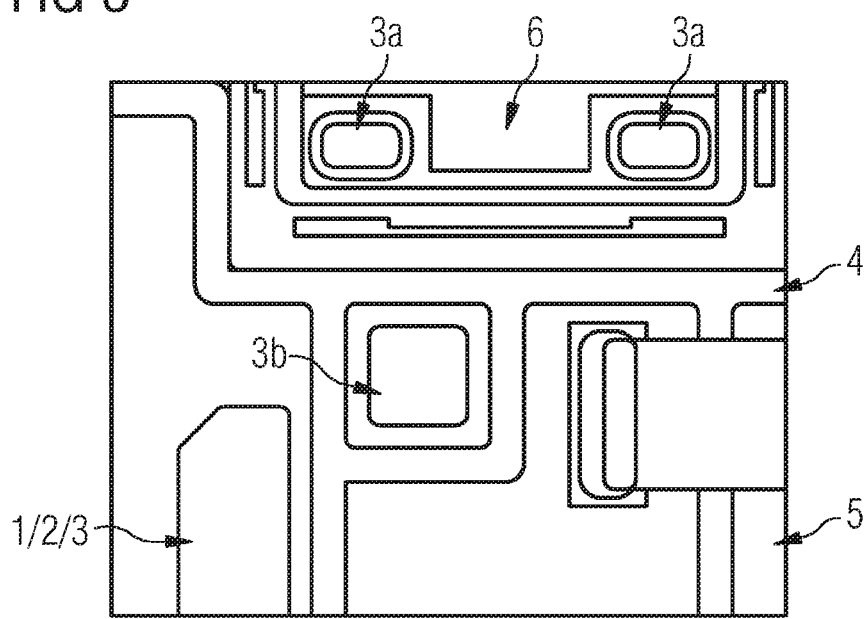

METHOD FOR SELECTIVELY PRODUCING FILM LAMINATES FOR PACKAGING AND FOR INSULATING UNPACKAGED ELECTRONIC COMPONENTS AND FUNCTIONAL PATTERNS AND CORRESPONDING DEVICE

CROSS REFERENCE TO RELATED APPLICATIONS

This application is based on and hereby claims priority to German Application No. 10 2006 007 790.3, filed on Feb. 20, 2006, German Application 10 2006 012 232.1 filed on Mar. 16, 2006 and PCT Application No. PCT/EP2006/070026 filed on Dec. 20, 2006, the contents of which are hereby incorporated by reference.

BACKGROUND OF THE INVENTION

The invention relates to a method for coating surface regions of functional patterns arranged on a substrate and/or of surface regions of electronic components arranged on the substrate. Devices are created for said methods. Different functions are assigned to the coatings. They can be for example electrical or thermal insulations, or a mechanical protection. From this point on semiconductor chips will be used as exemplary electronic components. All conventional semiconductor components are semiconductor chips. Functional patterns are all the structures that are assigned to a particular purpose and arranged on a substrate.

According to conventional methods a coating is applied in which only one insulation layer is created in the corresponding function level located on a substrate or on semiconductor chips in such a way that the properties of the insulation are adapted to different functional patterns or semiconductor chips. The adaptation of the single insulation layer to different functional patterns or semiconductor chips is only approximate. If for example it is intended that an insulation layer, with respect to its electrically insulating properties, must take account of various voltage levels in individual components, the thickness of the single insulation layer must be adapted to the highest voltage level. The extent to which the electrical, thermal and thermo-mechanical properties of the whole component can be adapted is therefore only limited. It is apparent that for example thinner insulation layers are adequate for the individual components that have lower voltage levels. In the conventional approach the single insulation layer is adapted to the most extreme of the requirements, such as the dielectric strength. By the same token, in the case of the single insulation layer this disadvantage occurs for thermal insulations of different individual components. In this case the thermal insulating properties of the single insulation layer must also be adapted to the most extreme individual component. This likewise concerns thermo-mechanical requirements for the properties of the single insulation layer. The single insulation layer can also be adapted so that an average value of properties is selected in respect of, for example, the dielectric requirements for said single insulation layer. In the conventional approach the single insulation layer is inadequately adapted to the requirements of the functional pattern and/or the semiconductor chip. In either case the adaptation of the single insulation layer can be too extreme or inadequate. The conventional approach uses an insulating material that only approximates to the different requirements of individual components. A conventional coating of the single insulating material is applied for example by spray lacquering, physical vapor deposition (PVD), a dipping method, laminating, or as heat-cured paste printing (glob top). Because of the specific requirements imposed by functional patterns and/or semiconductor chips, the use of only one insulating material in a function level is disadvantageous.

SUMMARY

One possible object is to improve a insulation on a substrate having functional patterns and/or semiconductor components so effectively that this insulation is better adapted in its properties to different requirements of functional patterns and/or semiconductor chips.

The inventors propose individually adapted insulating materials in a single function level for assembling and packaging the integrated circuits in three-dimensional modules. This is particularly advantageous for a packaging method based on planar electrical contacting, and for film packages, unpackaged chips and the integration of passive and active components. An individual film in which the properties of the plastics material are adapted to the function of said film, or to the requirements imposed by the functional pattern and/or the semiconductor chip, is used in every case for each surface region of functional patterns and/or of electronic components or semiconductor chips, as a result of which the insulation can be adapted with respect to, for example, the dielectric, thermal and thermo-mechanical requirements of the individual components or functional patterns. The films can be plastic films. Examples of film materials for a plastic film are polyimides, which can be laminated by acrylic adhesives. Polyimides can be used with a wide range of substrates, covering films and composite films. The melting point is around 260° C. Further suitable plastics are the so-called LC (liquid crystal) polymers, which have high melting temperatures and absorb only small amounts of water from the environment. Further suitable plastics are materials with aramid reinforcement. Examples of such materials are Duramid and Arlon 65 GT.

The functions of a film can include the electrical or thermal insulation of high-tension or low-tension components, the creation of dielectrics, or mechanical protection against for example contamination or mechanical loading. The method and product are particularly advantageous in the encapsulation of insulated gate field effect transistors (IGFET), metal oxide semiconductor field effect transistors (MOSFET), silicon-based integrated circuits (Si-IC), inductors or capacitors or IGBTs, in particular when carried out using so-called high thermal dielectric encapsulation. An insulated gate bipolar transistor (IGBT) is a semiconductor component that is being increasingly used, since it combines the advantages of the bipolar transistor (favorable transmittance characteristics, high block voltage) and of the field effect transistor (virtually no control current required). Also advantageous is a certain robustness against short circuits, since IGBTs limit the load current. IGBTs are used in the high power range among others, since they have a high block voltage (at the present time up to 6.6 kV) and can be used for high current intensities (as high as 3 kA).

A plurality of functionally adapted insulating materials in the form of laminated regions or laminated islands is applied within a single level. The film laminates are selectively formed and applied by a combined step involving a laser and lamination. In said step the films are cut by laser according to the positions of components and simultaneously attached to the components or to the substrate by melting around the edges of the film. Films are held in place during laser cutting by a vacuum table. Lastly the films are laminated onto the appropriate surface regions. Any residual film surround can be removed and the next film can be lasered onto the further component positions by the same method.

The use of selectively formed film laminates, in particular in a single function level, brings about increased design freedom with regard to the dielectric, thermal or thermo-mechanical requirements expected of the insulating material, for example. Arising from this in particular are advantages with regard to the reliability and integration capabilities of different kinds of components or functional patterns. Moreover, individually adapted material envelopes can be formed, for example as mechanical protection (film packages) for unpackaged semiconductor chips or functional patterns.

According to an advantageous embodiment, a common, uniform one-piece film (rather than individual films) is attached by vacuum to surface regions of the functional pattern or semiconductor chip that have the same requirements in each case regarding the properties of the plastic film material. With this, a single film with uniform properties can be shaped and attached to all relevant surface regions. When all film regions have been cut out by laser and attached by melting, the films can be laminated on the respective surface regions.

A further uniform film for further surface regions having the same requirements in each case can be formed and attached. This can be done as often as required.

According to a further advantageous embodiment, functional patterns are created as conductors, resistors or capacitors. Conductors and resistors can be created as, for example, planar structures of different widths. An appropriate film can be laminated on a region of a functional pattern.

In a further advantageous embodiment the semiconductor chips are, for example, transistors, integrated circuits, inductors and/or capacitors. In this way the insulating films can be used in a versatile manner.

Adapting the properties of the plastic material to the requirements imposed by the functional pattern or the semiconductor chip influences the properties of the film with regard to their dielectric, thermal and/or thermo-mechanical properties. Further properties can be chemical or physical stability, for example in the presence of moisture or the like.

In a further advantageous embodiment, the films are used as packages and/or in general as insulations for functional patterns and/or semiconductor chips.

According to a further advantageous embodiment, the laminated films are in a single function level. In this way lamination is particularly easy.

According to a further preferred embodiment, the residual film extending beyond the shape of the surface regions is removed, for example by a gas stream, after the laser cutting step. This removal can also be performed manually.

Devices with surface regions of functional patterns arranged on a substrate, and/or with surface regions of semiconductor chips arranged on said substrate, that have been coated by one of the methods mentioned above, are also within a scope of legal protection.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 2 A second exemplary embodiment of a created device;

FIG. 3 A third exemplary embodiment of a created device.

DETAILED DESCRIPTION OF THE PREFERRED EMBODIMENT

Figure 1:
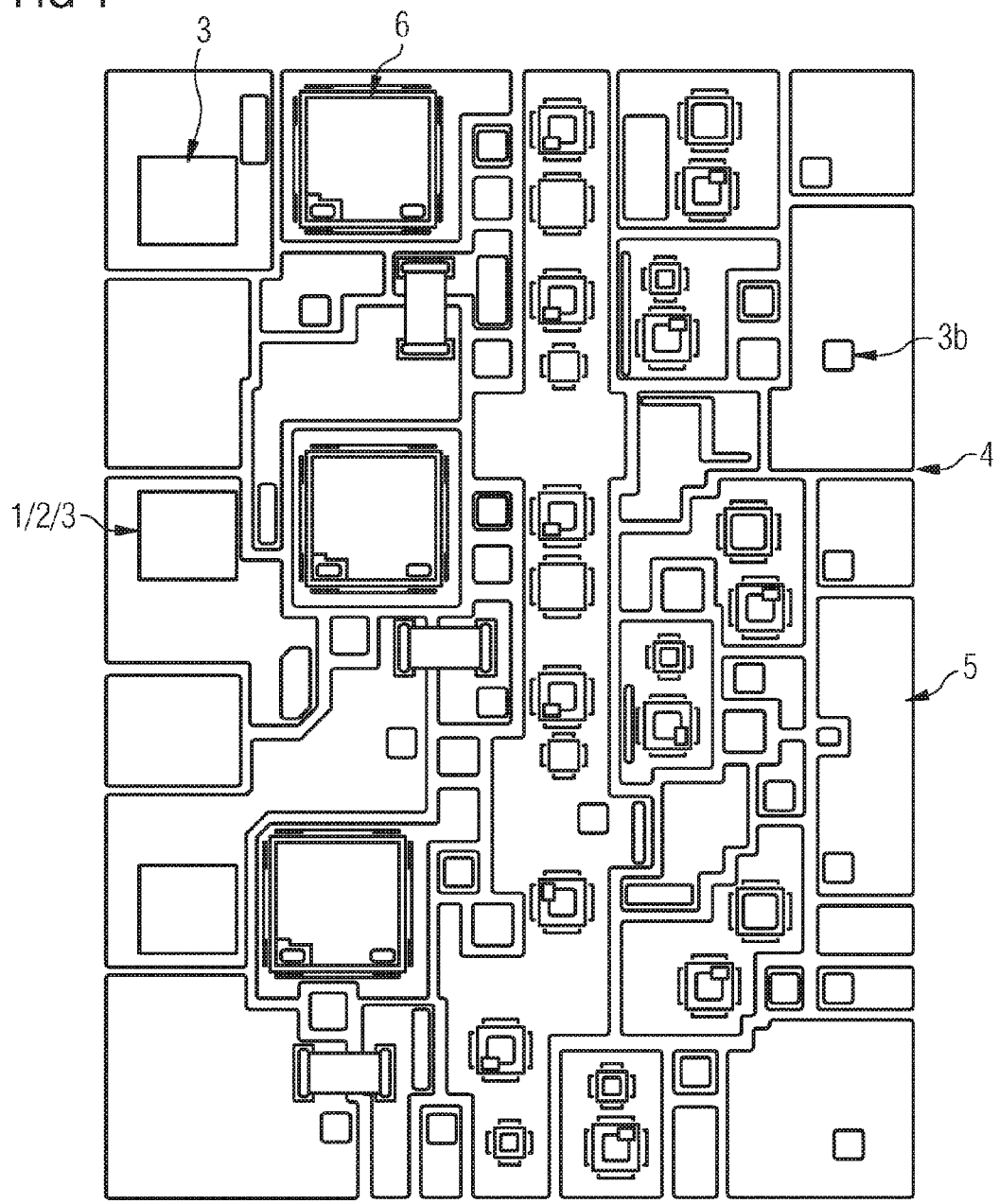
FIG. 1 A first exemplary embodiment of a created device.

Reference will now be made in detail to the preferred embodiments of the present invention, examples of which are illustrated in the accompanying drawings, wherein like reference numerals refer to like elements throughout.

FIG. 1 shows selectively formed film patterns 5 after a first laser cut. FIG. 1 shows the film patterns or film regions 1 before the lamination of films 3, 3a, 3b onto the respective film region 1. The film regions 1 can be precisely positioned to within an accuracy of 50 µm. The film regions 1 are attached to the surface regions 2 by melting around the edges of the film region. Lastly the films 3, 3a, 3b, which have been adapted to meet requirements, are laminated onto the respective surface regions 2.

FIG. 1 shows associated surface regions 2 coated with film regions 1, wherein the film regions 1 are attached along the lines of cut to the surface regions 2 by melted areas at the edges of the films 3, 3a, 3b. Film regions 1 overlay associated surface regions 2. The film regions 1 have different shapes and sizes corresponding to the surface regions 2 that are to be coated. After the first laser cut, further insulating layers or insulating films or films 3, 3a, 3b can be applied. Lastly the films 3, 3a, 3b are actually laminated onto the respective surface regions 2. The film regions 1 can have any shape required.

FIG. 2 shows a further exemplary embodiment of formed film patterns 1 on a semiconductor chip level and substrate level. The figure shows two different film materials that have already been laminated on the respective surface region. FIG. 2 shows different films 3a and 3b.

FIG. 3 shows a further exemplary embodiment of films 3a laminated on respective surface regions 2. Said films differ from laminated films 3b in their properties. FIG. 3 shows the formed film patterns on the chip level and substrate level with two different film materials after lamination.

The shapes of the film regions 1 and the surface regions 2 can take any required form. The films 3, 3a, 3b can also be used for packaging functional patterns 5 or semiconductor chips 6.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B, and C may be used, contrary to the holding in *Superguide v. DIRECTV*, 69 USPQ2d 1865 (Fed. Cir. 2004).

The invention claimed is:

1. A method for coating surface regions of functional patterns and/or electronic components, arranged on a substrate, comprising:

attaching a plurality of films of insulating plastic material, each film being attached to and contiguous with at least one respective surface region, the films being attached with a vacuum process;

laser cutting the films along lines of cut, each film being cut to a form of the respective surface region;

attaching the films onto the respective surface regions in the process of laser cutting the films, the films being attached by melting the films onto the respective surface regions along the lines of cut; and laminating the films onto the respective surface regions, wherein at least one of the surface regions has properties different from those of another of the surface regions, and the insulating plastic material of each film has properties that are adapted to the properties of the respective surface region.

2. The method as claimed in claim 1, wherein
for all surface regions respectively having the same properties, a common, uniform film instead of separate films, is attached.

3. The method as claimed in claim 1, wherein
the surface regions include functional patterns, and
the functional patterns are conductors, resistors and/or capacitors.

4. The method as claimed in claim 1, wherein
the surface regions include electronic components, and
the electronic components are transistors, integrated circuits, inductors, resistors and/or capacitors.

5. The method as claimed in claim 1, wherein
dielectric, thermal and/or thermo-mechanical properties of the insulating plastic material are adapted to the different properties of the surface regions.

6. The method as claimed in claim 1, wherein
the films create packages and/or insulators for the functional patterns and/or electronic components.

7. The method as claimed in claim 1, wherein
the films are laminated onto the surface regions at a single level.

8. The method as claimed in claim 1, wherein
after laser cutting, residual film portions remain beyond the lines of cut, and
the residual film portions are removed after laser cutting.

9. The method as claimed in claim 8, wherein
the residual film portions are removed by a gas stream.

10. The method as claimed in claim 2, wherein
the surface regions include functional patterns, and
the functional patterns are conductors, resistors and/or capacitors.

11. The method as claimed in claim 10, wherein
the surface regions include electronic components, and
the electronic components are transistors, integrated circuits, inductors, resistors and/or capacitors.

12. The method as claimed in claim 11, wherein
dielectric, thermal and/or thermo-mechanical properties of the insulating plastic material are adapted to the different properties of the surface regions.

13. The method as claimed in claim 12, wherein
the films create packages and/or insulators for the functional patterns and/or electronic components.

14. The method as claimed in claim 13, wherein
the films are laminated onto the surface regions at a single level.

15. The method as claimed in claim 14, wherein
after laser cutting, residual film portions remain beyond the lines of cut, and
the residual film portions are removed after laser cutting.

16. The method as claimed in claim 15, wherein
the residual film portions are removed by a gas stream.

* * * * *